(12) United States Patent
Kim et al.

(10) Patent No.: US 9,099,185 B2
(45) Date of Patent: Aug. 4, 2015

(54) USING DIFFERENT PROGRAMMING MODES TO STORE DATA TO A MEMORY CELL

(71) Applicant: Seagate Technology LLC, Cupertino, CA (US)

(72) Inventors: YoungPil Kim, Eden Prairie, MN (US); Rodney Virgil Bowman, Bloomington, MN (US); Dadi Setiadi, Edina, MN (US); Wei Tian, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 42 days.

(21) Appl. No.: 14/136,708

(22) Filed: Dec. 20, 2013

(65) Prior Publication Data

US 2015/0179268 A1 Jun. 25, 2015

(51) Int. Cl.
*G11C 16/04* (2006.01)
*G11C 16/14* (2006.01)
*G11C 13/00* (2006.01)

(52) U.S. Cl.
CPC .............. *G11C 16/14* (2013.01); *G11C 13/004* (2013.01)

(58) Field of Classification Search
USPC ...................... 365/148, 185.03, 236
See application file for complete search history.

(56) References Cited

U.S. PATENT DOCUMENTS

| | | | |
|---|---|---|---|
| 7,366,013 B2 | 4/2008 | Roohparvar | |
| 7,474,560 B2 | 1/2009 | Aritome | |
| 7,548,457 B2 | 6/2009 | Kang et al. | |
| 7,609,548 B2 | 10/2009 | Park | |
| 8,199,572 B2 | 6/2012 | Aritome | |
| 8,335,886 B2 | 12/2012 | Lee | |
| 2013/0173844 A1 | 7/2013 | Chen et al. | |
| 2013/0304966 A1* | 11/2013 | Joo | 711/103 |

* cited by examiner

*Primary Examiner* — Hoai V Ho
(74) *Attorney, Agent, or Firm* — Hall Estill Attorneys at Law (57) ABSTRACT

Method and apparatus for managing data in a memory, such as a flash memory array. In accordance with some embodiments, a memory cell is provided with a plurality of available programming states to accommodate multi-level cell (MLC) programming. A control circuit stores a single bit logical value to the memory cell using single level cell (SLC) programming to provide a first read margin between first and second available programming states. The control circuit subsequently stores a single bit logical value to the memory cell using virtual multi-level cell (VMLC) programming to provide a larger, second read margin between the first available programming state and a third available programming state.

20 Claims, 5 Drawing Sheets

USING DIFFERENT PROGRAMMING MODES TO STORE DATA TO A MEMORY CELL

SUMMARY

Various embodiments of the present disclosure are generally directed to the management of data in a memory, such as but not limited to a flash memory array.

In accordance with some embodiments, a memory cell is provided with a plurality of available programming states to accommodate multi-level cell (MLC) programming. A control circuit is adapted to store a single bit logical value to the memory cell using single level cell (SLC) programming to provide a first read margin between first and second available programming states. The control circuit is further adapted to store a single bit logical value to the memory cell using virtual multi-level cell (VMLC) programming to provide a larger, second read margin between the first available programming state and a third available programming state.

These and other features which may characterize various embodiments can be understood in view of the following detailed discussion and the accompanying drawings.

DETAILED DESCRIPTION

The present disclosure generally relates to managing data stored in a memory module, such as but not limited to a flash memory array of a data storage device.

Flash memory, as well as other types of non-volatile solid-state memories, can be programmed as single level cells (SLCs) or multi-level cells (MLCs). SLCs store a single bit per memory cell, whereas MLCs store multiple bits per memory cell. Generally, MLCs can store N bits using $2^N$ programmable states, such as two bits (N=2) using four states ($2^N$=4).

A row of flash memory cells can be initially programmed as SLCs to store a first block (page) of data, with each cell storing a single bit having an associated logical value of 1 or 0. A second page of data can be added to the cells by converting the cells to MLCs so that each cell stores two bits (e.g., logical values of 11, 01, 00 or 10). In the MLC mode, the least significant bit (LSB) of each cell represents the first (lower) page of data, and the most significant bit (MSB) of each cell represents the second (upper) page of data.

The programming of flash memory cells can present a number of challenges since electrical charge can usually only be added to a given cell; a separate erasure operation is usually required to remove accumulated charge and return the cells to an initial erased condition (1 or 11, respectively) before new replacement data can be written to the cell.

MLC programming essentially doubles (or more) the amount of storage capacity of a given flash memory as compared to the storage capacity available using SLC programming, since two (or more) bits are stored per cell as compared to a single bit per cell. At the same time, it has been found that MLC programming may tend to significantly reduce the operational life of the memory, such as by up to 90% or more. For example, MLCs may be rated at around 10,000 program/erasure (PE) cycles before reaching an end of life condition as compared to around 100,000 PE cycles for SLCs.

MLC programming also tends to be slower than SLC programming, in that writing a second page to a row of cells to form MLCs may take several times longer than it took to write the first page to the cells using SLC programming. Reading MLCs can also sometimes require more time than reading SLCs. Still, flash memory is relatively fast, and techniques such as read/write caching strategies and wear leveling can be used to reduce the effects of these and other performance hits associated with MLC programming.

Various embodiments of the present disclosure are generally directed to the management of data in a memory that uses memory cells with various programming modes. As explained below, some embodiments provide an arrangement of memory cells, with each memory cell having a plurality of available programming states to support multi-level cell (MLC) programming; that is, a sufficient number of available programming states are provided to accommodate the storage or one or more bits, with each bit having an associated logical value.

A control circuit is adapted to store a single bit logical value to the memory cell using single level cell (SLC) programming to provide a first read margin between first and second available programming states. The control circuit is further adapted to subsequently store a single bit logical value to the memory cell using virtual multi-level cell (VMLC) programming to provide a larger, second read margin between the first available programming state and a third available programming state.

In some cases, the first programming state is an erased state so that substantially no accumulated charge is present on the memory cell, the second programming state is an intermediate state with a moderate amount of accumulated charge, and the third programming state is a fully programmed state with a maximum amount of accumulated charge.

One or more end of life (EOL) conditions may be detected in response to an accumulated aging parameter, such as a number of access counts upon the selected memory cell using a given programming mode. The access counts can take a variety of forms, such as but not limited to program/erase (PE) cycles. In this way, greater read margin is supplied to the programmed cell as the cell ages to enhance reliability and extend the operational life of the cell.

As desired, different regions of the memory can be assigned different modes of operation, so that the cells in a first area are programmed using SLC mode, the cells in a second area are programmed using MLC mode, and the cells in a third area are programmed using VMLC mode. The cells programmed in the SLC and MLC mode regions can be transitioned to VMLC mode responsive to an accumulated PE count or other parameter.

While flash memory cells are contemplated, such is merely exemplary and not necessarily limiting. Any number of different types of non-volatile solid-state memories can be used, such as but not limited to resistive sense memory (RSM) cells that utilize programmed electrical resistances to indicate logical values of stored bits. Such RSM cells can take the form of magnetic random access memory (MRAM), spin-torque transfer random access memory (STRAM), resistive random access memory (RRAM), phase change random access memory (PCRAM), programmable logic cells (PLCs), etc.

Figure 1:
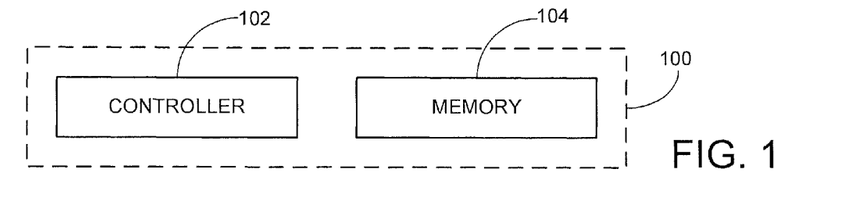
FIG. 1 provides a functional block representation of a data storage device in accordance with various embodiments of the present disclosure.

These and other features of various disclosed embodiments can be understood beginning with a review of FIG. 1 which provides a block diagram of a data storage device 100. The data storage device 100 includes a controller 102 and a memory module 104. The controller 102 provides top level control functions for the device 100 and may be realized as a hardware-based or programmable processor. The memory module 104 may take a variety of forms and includes non-volatile memory adapted to store and retrieve user data from a host device (not separately shown). In some cases, the controller functionality can be incorporated directly into the memory module 104.

For purposes of providing a concrete example, the device 100 will be contemplated as comprising a flash memory based device, such as a solid state drive (SSD), a portable USB thumb drive, etc. Other applications are readily contemplated, including but not limited to devices that utilize rotatable storage media (e.g., hard disc drives (HDDs)), hybrid devices that utilize multiple forms of media such as different forms of solid-state memory, solid-state memory and rotatable media, etc.

Figure 2:
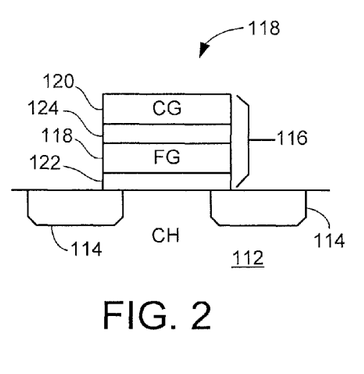
FIG. 2 shows a flash memory cell construction that can be used in the device of FIG. 1.

FIG. 2 shows a flash memory cell 110 that may be incorporated into the memory module 104 of FIG. 1. The flash memory cell 110 is formed on a semiconductor substrate 112 having spaced apart n+ doped regions 114. A gate structure 116 spans the pair of adjacent doped regions so that the flash memory cell 110 (hereinafter "memory cell," "flash cell," "cell," etc.) takes a general nMOS transistor configuration. Additional flash cells can be formed on the substrate 112 in a NAND configuration so that each adjacent pair of the doped regions 114 is provided with an associated gate structure 116.

The gate structure 116 provides an alternating stack of electrically conductive gates 118, 120 and electrically insulative regions 122, 124. Data are stored by each cell 110 in relation to the relative amount of accumulated electrical charge stored on the lower gate 118, which is characterized as a floating gate (FG).

The floating gate 118 accumulates charge during a programming operation by the selected application of appropriate voltages to the adjacent doped (drain and source) regions 114 and the upper gate 120, which is characterized as a control gate (CG). These applied voltages induce the controlled migration of electrical charge from a channel (CH) portion of the semiconductor substrate 112 to the floating gate 118 across insulative region 122.

In an initially erased state, no accumulated charge will tend to be present on the floating gate 118. In this state, the cell 110 will nominally exhibit drain-source conductivity across the channel without the application of significant voltage to the control gate 120. As increasingly higher levels of charge are accumulated on the floating gate 118, correspondingly higher control gate (CG) voltages will be required to place the drain-source path in a conductive state. The programmed state of the cell can be determined by sensing the level of control gate voltage required to allow drain-source current to pass through the cell, which generally correlates to the amount of accumulated charge on the floating gate.

A special erasure operation is required to remove accumulated charge from the floating gate 118. An erasure can be carried by the application of a relatively high voltage to the control gate 120 to cause migration of the charge from the floating gate 118 back to the channel. A different set of programming voltages may be applied to the cell to thereafter add charge to the floating gate during a subsequent data write operation.

Figure 3:
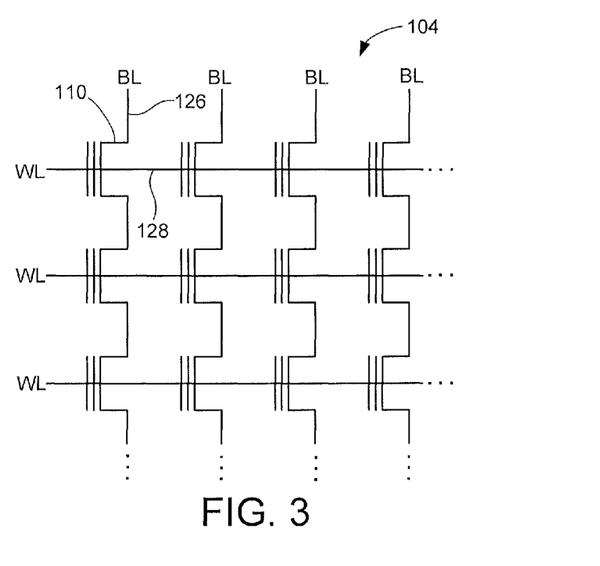
FIG. 3 is a schematic depiction of a portion of a flash memory array using the cells of FIG. 2.

Memory cells such as 110 can be arranged in the memory module 104 as an array of rows and columns of memory cells, as generally depicted in FIG. 3. Each column of adjacent cells can be coupled via one or more bit lines (BL) 126. The control gates 120 of the cells 110 along each row can be interconnected via individual word lines (WL) 128.

Figure 4:
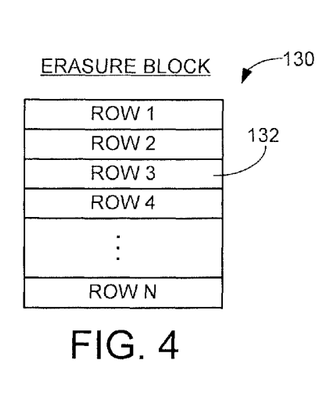
FIG. 4 illustrates an exemplary format for an erasure block of the flash memory array.
Figure 5:
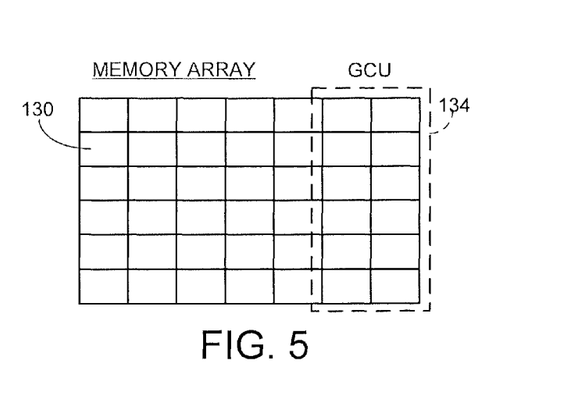
FIG. 5 shows an arrangement of erasure blocks into a garbage collection unit (GCU) which is allocated and erased as a unit in some embodiments.

The array of memory cells shown in FIG. 3 are grouped into erasure blocks 130 as depicted in FIGS. 4 and 5. Each erasure block 130 is a separately addressable block of memory and represents the smallest unit of memory that can be concurrent erased at a time. Each erasure block 130 is arranged as a plurality of rows 132 of memory cells, with each row sharing a common word line (FIG. 3) and accommodating the storage of a selected amount of user data. An example erasure block size is 128 rows of cells, with each row storing 8192 bytes of user data. Other sizes can be used.

Block-level wear leveling may be employed to track the erase and write status of the various erasure blocks 130. New blocks will be allocated for use as required to accommodate newly received data. In some embodiments, groups of blocks 130 may be accumulated into larger garbage collection units (GCUs) 134 which are allocated, used and erased as a unit. GCUs 134 may take any suitable size.

In at least some embodiments, a fixed size set of data, sometimes referred to as a page, is written to each row 132 at a time. The page size may correspond to a logical sector, or multiple user sectors may be incorporated into each page's worth of data. The sectors may each have an associated logical address, such as a logical block address (LBA). Error correction codes such as parity bits or Reed Solomon codes may be incorporated at the page level to correct errors as a full page worth of data is retrieved. Metadata and other control information may be stored in each erasure block 130, or stored elsewhere such as in specific blocks dedicated to this purpose.

Figure 6:
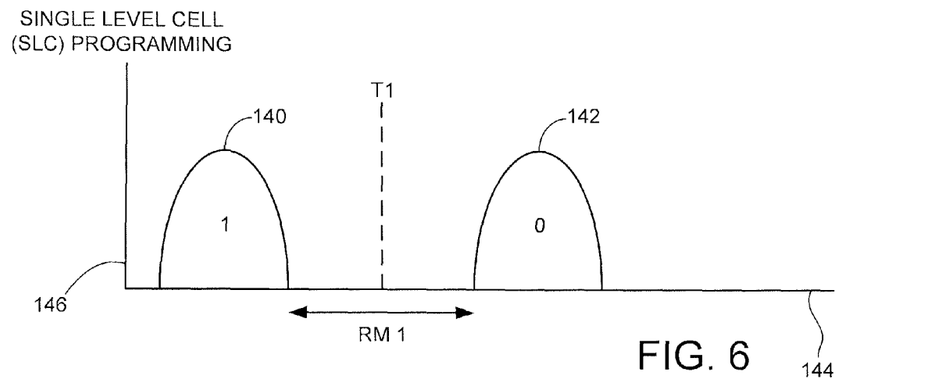
FIG. 6 shows different distributions of charge that may be stored in populations of memory cells in the flash memory array using single level cell (SLC) programming.

Different programming modes are used to program the cells in FIGS. 1-5. FIG. 6 illustrates a single level cell (SLC) programming mode, which generally involves storing a single bit to each cell. The SLC mode uses two normalized charge distributions 140, 142 to represent two different logical values (logic states) 1 and 0. The distributions 140, 142 are plotted against a common x-axis 144 indicative of voltage magnitude and a common y-axis 146 indicative of cell population count.

The distributions 140 and 142 generally represent two available programming states of the cells, so that programmed cells will fall within one of these two states. The distributions are generally Gaussian in shape, but other shapes may be provided. Distribution 140 represents variation in the amount of charge on the memory cells in the array that have been programmed to single bit logical value 1, which may be an erased state (essentially no accumulated charge). Distribution 142 represents charge on the memory cells in the array that have been programmed to single bit logical value 0, which provides a moderate amount of accumulated charge on the associated floating gates.

The respective charge distributions 140, 142 are separated by a first read margin (RM 1). The read margin is a voltage sense window that allows the application of a suitable read-threshold voltage T1 therein to differentiate between the respective programmed states. Threshold T1 nominally provides a voltage level sufficient to place all of the memory cells in distribution 140 into a source-drain conductive state, but insufficient to place the cells in distribution 142 into a conductive state. The programmed states of the cells can be individually sensed in relation to whether the T1 voltage places the cell into a conductive state.

Initially, each erasure block 130 will tend to have all of the memory cells 110 in the erased state, so that all of the cells begin in distribution 140. A page of multi-bit data may be written to a selected row 132 by writing 0's in the appropriate bit locations and leaving the cells corresponding to the 1's in the erased state. This will shift some of the cells to the distribution 142 while leaving others in the distribution 140. While not depicted in the figures, a small amount of charge may be applied to the cells in distribution 140 during a write "1" operation.

Figure 7:
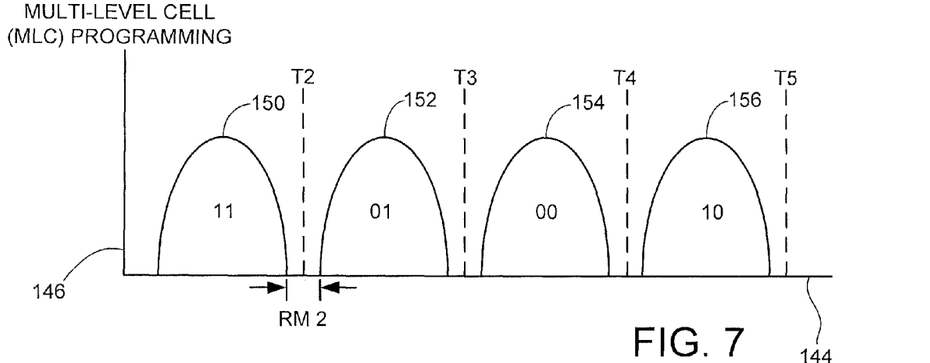
FIG. 7 shows different distributions of charge that may be stored in populations of memory cells in the flash memory array using multi-level cell (MLC) programming.

FIG. 7 illustrates a multi-level cell (MLC) programming mode. The MLC mode involves storing multiple bits per cell, such as two bits per cell. FIG. 7 shows four normalized charge distributions 150, 152, 154 and 156, plotted against the x-y axes 144, 146 of FIG. 6. The distributions thus represent four available programming states of the cells which respectively correspond to multi-bit logical values 11, 01, 00 and 10. Other conventions can be used.

The programming states in FIG. 7 can be obtained by writing a second (upper) page of data to a group of cells that already stores a first (lower) page of data using the SLC mode of FIG. 6. The least significant bit (LSB) in each of the logical values 11, 01, 00 and 10 corresponds to the lower page of data, and the most significant bit (MSB) corresponds to the upper page of data.

The final state of a given cell during MLC programming will depend on its prior SLC programming state. To give a concrete example, assume a given cell stores logical value 1 for the lower page during SLC programming (that is, the cell falls within distribution 140 in FIG. 6). MLC programming will provide a final multi-bit logical value of 11 (distribution 150) if the upper page writes a 1, and a final multi-bit logical value of 01 (distribution 152) if the upper page writes a 0 during MLC programming.

Similarly, if the cell initially stores logical value 0 for the lower page during SLC programming (that is, the cell falls within distribution 142 in FIG. 6), the final storage state will either be logical value 00 (distribution 154) or logical value 10 (distribution 156) depending on whether a 0 or a 1 is written for the upper page during MLC programming.

Due to the use of different SLC and MLC drivers, there may be some small amount of offset between the 0 distribution 142 in FIG. 6 and the 00 distribution 154 in FIG. 7. For purposes herein, these will be considered to be nominally the same available programming state. More generally, each cell can be characterized as having four available programming states (FIG. 7), with all four being used during MLC programming and only two being used during SLC programming (FIG. 6).

Each of the distributions 150, 152, 154 and 156 are separated by a second read margin (RM 2). It will be noted that the second read margin RM 2 is significantly smaller than the first read margin RM 1. Threshold voltages T2, T3 and T4 are provided between adjacent pairs of the distributions so as to fall within these RM 2 read margin windows. Each threshold is sufficient to place all of the cells to the left of that threshold in a conductive state. A top threshold T5 is sufficiently high to ensure all of the cells are placed in a conductive state irrespective of programming state.

A sequence of thresholds may be applied to sense the programmed state of a given MLC as programmed in FIG. 7. For example, if the application of threshold T3 renders the cell conductive, then it can be determined that the storage state is either 11 or 01. The subsequent application of threshold T2 will allow differentiation between these two states. Conversely, if the cell remains non-conductive during application of threshold T3, then application of threshold T4 will determine the storage state to be 00 or 10.

Figure 8:
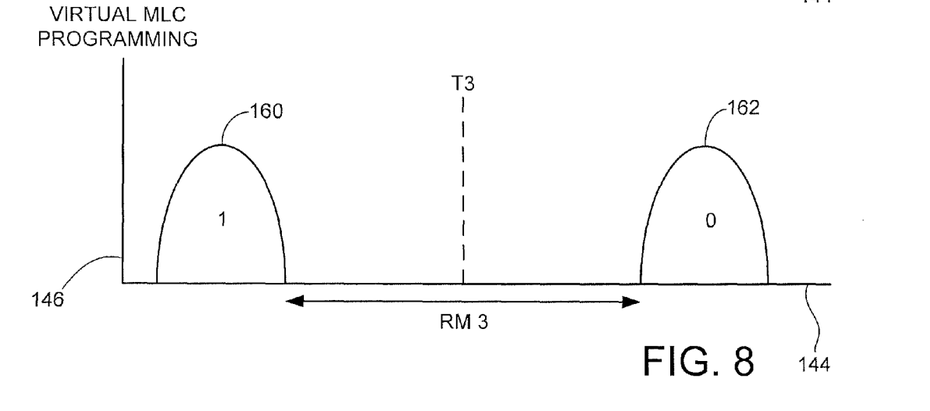
FIG. 8 shows different distributions of charge that may be stored in populations of memory cells in the flash memory array using so-called virtual multi-level cell (VMLC) programming.

FIG. 8 illustrates a third programming mode of operation sometimes referred to herein as virtual multi-level cell (VMLC) programming. Generally, VMLC programming stores a single bit in a manner similar to the SLC programming in FIG. 6, but utilizes one (or more) of the available MLC programming states from FIG. 7.

As shown in FIG. 8, VMLC programming uses two of the four available programming states from FIG. 7. A first VMLC distribution 160 represents the cells programmed to logical value 1, which generally corresponds to the 11 MLC distribution 150. A second VMLC distribution 162 represents cells programmed to logical value 0, which generally corresponds to the 10 MLC distribution 156. VMLC programming thus provides single bit storage in a manner similar to the SLC programming of FIG. 6, except with a third read margin (RM 3) that is significantly greater than the first read margin RM 1.

Each of the respective SLC, MLC and VMLC programming modes of FIGS. 6-8 can be applied to the same memory cells at different times during the operational life of the cells. In some cases, a progression is used such that the cells are initially stored as SLCs or MLCs until an associated life (EOL) threshold is reached, after which the cells are thereafter programmed as VMLCs. In other cases, the cells are progressively programmed as MLCs, SLCs and then VMLCs. In still other cases, different cells may be subjected to different programming modes at different times based on other factors.

Figure 9:
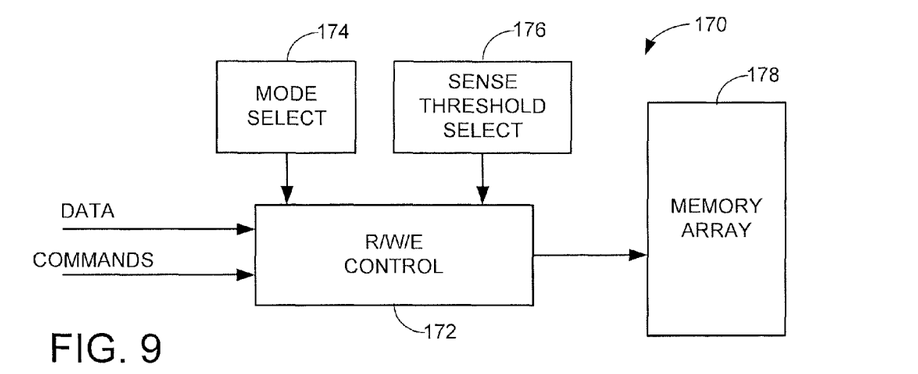
FIG. 9 is a functional block representation of control circuitry adapted to write data using the SLC, MLC and VMLC modes of FIGS. 6-8.

FIG. 9 is a functional block diagram of a control circuit 170 operative in some embodiments to select the various programming modes of FIGS. 6-8. The control circuit 170 includes a read/write/erase (R/W/E) control block 172, a mode select module 174 and a sense threshold select module 176. Data and commands are supplied to the R/W/E control block 172 to perform access operations upon memory cells in a memory array 178 of the memory module 104 (FIG. 1). The mode select block 174 signifies the appropriate programming mode (e.g., SLC, MLC, VMLC), and the sense threshold select block 176 supplies the appropriate voltage thresholds (e.g., T1-T5) to support the selected programming mode.

Figures 10, 11:
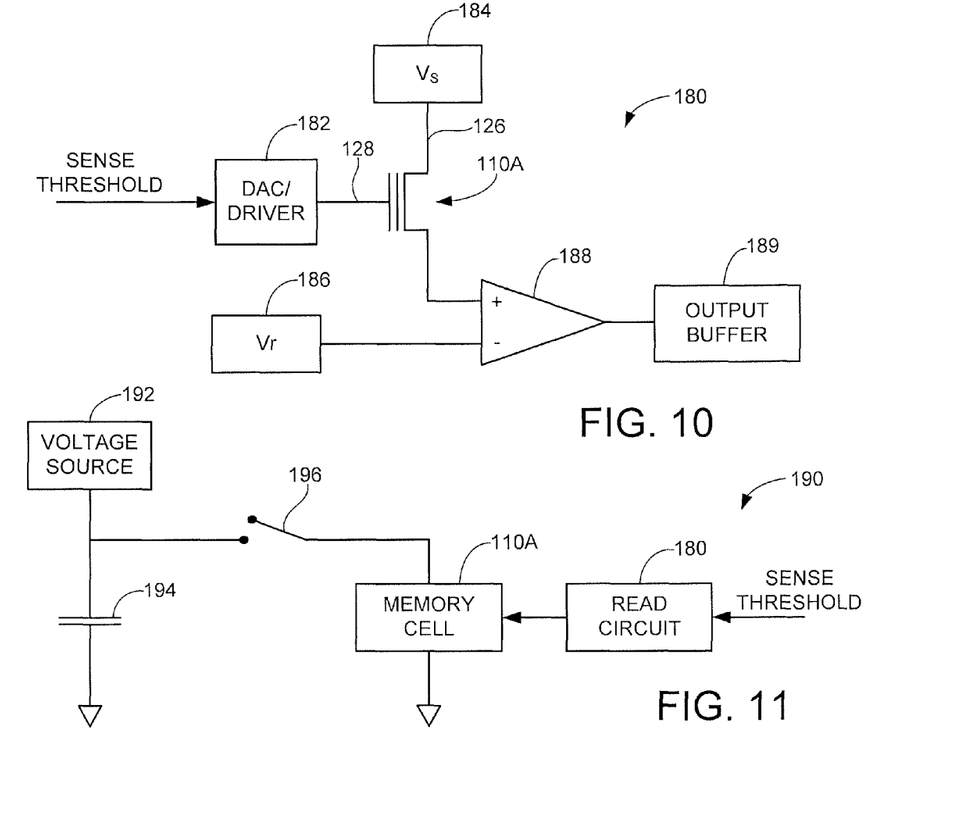
FIG. 10 shows read circuitry from FIG. 9.
FIG. 11 shows write circuitry from FIG. 9.

FIG. 10 is a simplified block diagram of a read circuit portion 180 of the R/W/E control block 172. The read circuit portion 180 generally operates to sense the programmed state of a selected flash memory cell 110A. A sense threshold corresponding to the programming mode is expressed as a multi-bit digital value and received by a digital-to-analog (DAC) driver 182. The DAC driver 182 applies a corresponding analog gate voltage to the control gate (130, FIG. 2) of the selected cell 110A using the associated word line 128.

A source voltage Vs is supplied by a voltage source 184 to the bit line 126 connected to the selected cell 110A. A reference source 186 supplies a reference voltage Vr, which may be a low voltage or ground potential. A comparator 188 senses whether the selected cell 110A is conductive or non-conductive in response to the applied voltage threshold, and outputs an associated sensed logical value (e.g., 1, 0, 01, etc.) to an output buffer 189. As noted above, MLC reading may involve a succession of voltage thresholds to sense the programmed state of the cell 110A.

FIG. 11 is a simplified block diagram of a write circuit portion 190 of the R/W/E control block 172 of FIG. 9. A charge pump arrangement may be formed using a voltage source 192, a storage device 194 and a switch 196. The storage device 194 may take the form of a capacitor and the switch 196 may take the form of a transistor. Discrete quanta (pulses) of electrical charge are accumulated on the storage device 194 and transferred via the switch 196 to the memory cell 110A to accumulate the desired amount of charge onto the floating gate (128, FIG. 2).

The read circuit 180, or another circuit similar to the read circuit, may be used to monitor the progress of the programming operation, by periodically performing program verify sense operations using suitable thresholds. Once the programmed state of the cell 110A is found to no longer be conductive responsive to a selected program verify sense threshold, further programming increments are halted. The program verify thresholds may be the same as, or different from, the read sense thresholds depicted in FIGS. 6-8.

Figure 12:
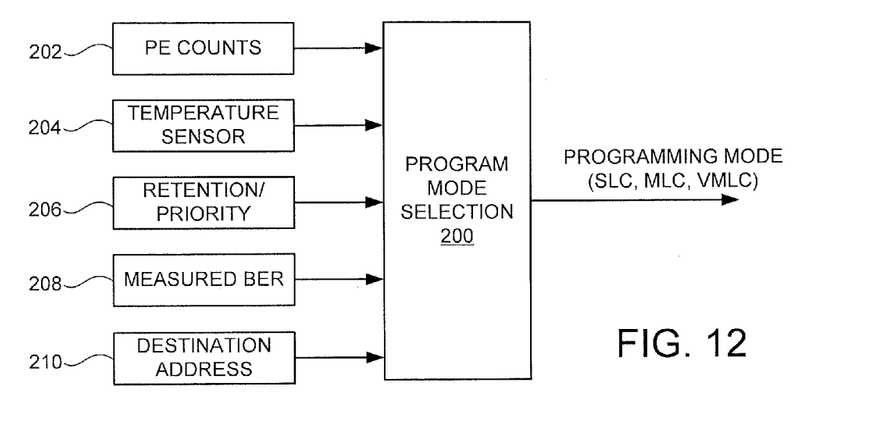
FIG. 12 depicts operation of the mode select module of FIG. 9 in accordance with some embodiments.

FIG. 12 depicts a program mode selection circuit 200 in accordance with some embodiments to select an appropriate programming mode for a given set of input write data. The circuit 200 can be incorporated into the mode select module 174 of FIG. 9.

The circuit 200 utilizes a number of inputs such as environmental and/or data-related parameters to select an appropriate programming mode. These parameters can include accumulated program/erase (PE) counts 202, temperature measurements from a temperature sensor 204, expected or predicted data retention requirements and/or priority levels associated with the input write data (block 206), measured bit error rate (BER) 208 associated with or experienced by the memory, and the destination address 210 for the write data. These and other parameters can be accumulated using various circuits and stored in suitable memory for access by the circuit 200 as required.

In some cases, the circuit 200 may utilize a set of rules, an algorithm, programming steps, lookup tables, parametric measurements, etc. to select the appropriate programming mode. Table I provides an example set of conditions under which different programming modes may be selected:

TABLE I

| Program Mode | Temperature | PE Counts | Retention | Data Size |
| --- | --- | --- | --- | --- |
| SLC | Hot | Large | Short | Small |
| MLC | Cold | Small | Long | Large |
| VMLC | Hot | Larger | Don't care | Small |

From Table I it can be seen that MLC programming may be more suitable for relatively cooler (Cold) operational conditions, whereas the SLC or VMLC modes may be selected under relatively warmer (Hot) operational conditions. Similarly, MLC may be more suitable for larger data sets and/or data sets with relatively longer expected data retention times as compared to the other modes. In other cases, a progression for a given set of cells from MLC to SLC to VMLC may be appropriate in response to performance and/or aging parameters such as ever increasing PE counts, degradations in observed BER rates, etc.

Figure 13:
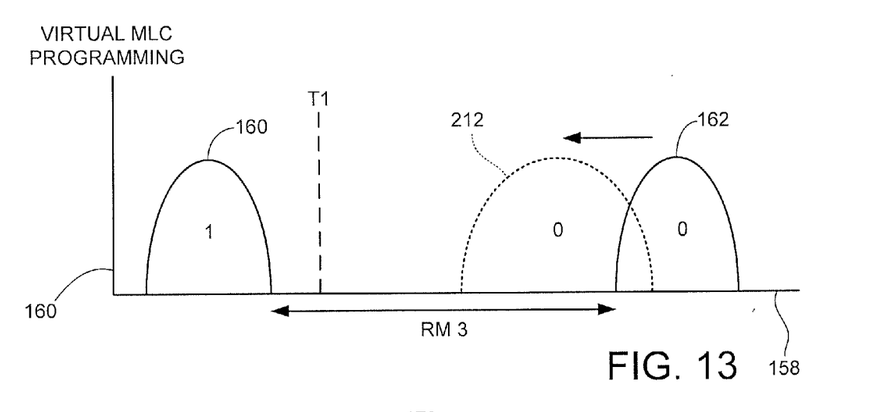
FIG. 13 graphically depicts charge drift variations that may be experienced during or after VMLC programming.

Switching to VMLC programming may extend the operational life of a memory, such as a flash memory, as the memory reaches an end of life (EOL) condition. FIG. 13 illustrates the VMLC distributions 160, 162 from FIG. 8 applied to cells with a relatively high accumulated PE count (or other aging parameter).

While nominal programming efforts may result in the cells having a final distribution represented at 162, the relatively larger read margin RM 3 accommodates more variation and/or drift in the final programmed states, so that an end of life VMLC upper programmed distribution may have greater variation such as represented by distribution 212. It follows that VMLC programming provides greater read margin over SLC programming, and "leaky" cells near end of life may still reliably store data that can be retained and sensed to an extent greater than that which could be achieved using conventional SLC programming. In some cases, a calculated or estimated end of life value for SLC programming may be reached, at which point the life of the memory can be further extended by switching to VMLC programming.

Figure 14:
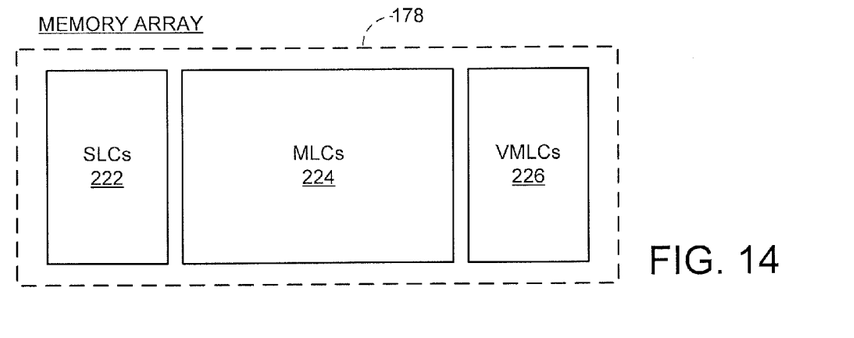
FIG. 14 illustrates the writing of data using SLC, MLC and VMLC programming modes to different areas of the memory array.

FIG. 14 illustrates another use of the various program modes selected by the circuit 200 of FIG. 12. In FIG. 14, the memory array 178 (FIG. 9) is divided up into different areas: a first area 220 configured to store data in SLCs, a second area 222 configured to store data in MLCs, and a third area 224 configured to store data in VMLCs. The respective amounts of memory capacity allocated to each type can vary, and can be adaptively changed as required.

It is contemplated that in systems configured such as in FIG. 14, over time the memory cells in SLC area 222 and/or MLC area 224 may be transitioned to VMLCs to extend operational life, reliability and performance. The selection of a given programming mode can be carried out at the memory module level, the controller level and/or the host level. Similarly, indications of which programming mode is employed for a given data set or location can be reported to the controller and/or host, as desired.

Figure 15:
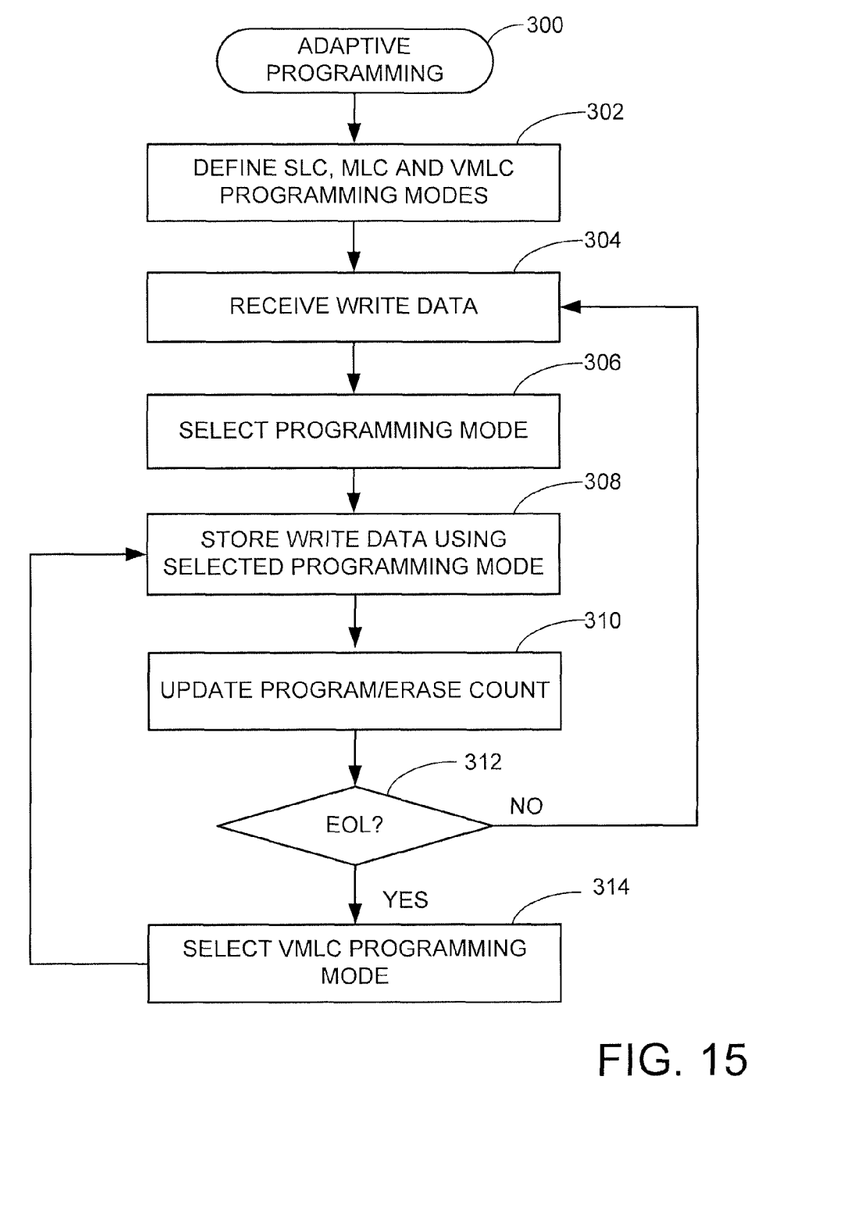
FIG. 15 is a flow chart for an ADAPTIVE PROGRAMMING routine generally illustrative of steps that may be carried out in accordance with some embodiments.

FIG. 15 provides an ADAPTIVE PROGRAMMING routine 300 illustrative of various embodiments discussed above. The routine 300 sets forth steps that may be carried out by a system such as, but not limited to, the device 100. It will be appreciated that the routine 300 is merely exemplary and various steps can be added, omitted, altered, performed in a different order, etc.

The routine commences at step 302 where various programming modes are selected for memory cells 110 of the device 100. The programming modes take into account a plurality of available programming states, so that a logical value, or values, stored by a given memory cell can be determined in response to the selected programming state in which the cell is placed.

In the case of flash memory cells as discussed herein, the available programming states may correspond to different discrete amounts of accumulated charge that may be placed on a floating gate structure. Other types of memory cells, such as resistive sense memory (RSM) cells that store data in the form of programmed resistances (e.g., MRAM, RRAM, STRAM, PCRAM, PLC, etc.), the available programming states may correspond to different programmable resistances that may be achieved by the respective cells. Example programming modes in step 302 include SLC, MLC and VMLC modes as discussed above in FIGS. 6-8.

The routine continues to step 304 where input write data are received for storage to the memory. The input write data may be temporarily buffered in a local memory pending transfer to the memory. Various signal processing steps may be applied to condition the input data, such as serialization, run length limited encoding, encryption, error correction coding, etc. A target address for the received write data may also be supplied at this time identifying a particular physical address (e.g., GCU, block, row/page, bit offset, etc.) to which the data are to be stored.

A suitable programming mode for the input write data is selected at step 306. This can be carried out in a variety of ways, including as set forth above in FIG. 9. Various parameters may be used as part of the mode selection process. The data are thereafter written (stored) to the destination address in the memory at step 308 using the selected programming mode of step 306. As desired, an accumulated PE counter may be incremented at step 310 to provide an up-to-date PE count for the destination address.

At this point it will be appreciated that the write data are programmed using a suitable programming mode (SLC, MLC, VMLC), and that the various steps 304-310 will be repeated as data are added to and removed from the memory during operation thereof. For clarity, it will be appreciated that MLC data may be initially written using SLC to store the lower page, followed by the writing of the upper page.

The time delay between the writing of the respective upper and lower pages to a given set of MLC memory cells can be relatively short, including writing the lower page followed immediately by writing the upper page. The time delay can also be relatively long so that the cells exist as SLC programmed cells for an extended period of time prior to being appended with additional data to convert such to MLC programmed cells.

Continuing with the routine, decision step 312 provides an end of life (EOL) query, which represents various points during the operational life of the device at which, due to aging related parameters, a change in programming mode may be suitable. Any number of different EOL thresholds can be used to transition from one more to the next.

As depicted in FIG. 15, a final EOL threshold indicates that the particular destination address has achieved a sufficiently high aging count that, thereafter, the memory cells at the destination address are consistently programmed using the VMLC programming mode.

It will be appreciated that a number of variations can be implemented depending on the requirements of a given application. In some cases, a mode progression of from MLC to SLC and then from SLC to VMLC is used, so that changes are not made from SLC to MLC or from VMLC to SLC. Also, for those cells that begin life being programmed as MLCs, a switch is made to SLCs at the end of life MLC point, followed by a potential extension to VMLC at the end of life SLC point.

While various embodiments discussed above are described in the context of a flash memory array, it will be appreciated that the techniques set forth herein are suitable for a variety of different operational environments, including other forms of non-volatile solid-state memories.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. An apparatus comprising:
    a memory cell having a plurality of available programming states to accommodate multi-level cell (MLC) programming; and
    a control circuit which stores only a single bit logical value to the memory cell using single level cell (SLC) programming to provide a first read margin between first and second available programming states, and which subsequently stores only a single bit logical value to the memory cell using virtual multi-level cell (VMLC) programming to provide a larger, second read margin between the first available programming state and a third available programming state.

2. The apparatus of claim 1, wherein the control circuit erases the memory cell between the storage of the single bit logical value using SLC programming and the storage of the single bit logical value using VMLC programming.

3. The apparatus of claim 1, wherein the memory cell is a flash memory cell and each of the plurality of available programming states corresponds to a different total amount of accumulated charge on a floating gate of the flash memory cell.

4. The apparatus of claim 1, wherein the memory cell is a resistive sense memory (RSM) cell and each of the plurality of available programming states corresponds to a different programmed electrical resistance of the cell.

5. The apparatus of claim 1, wherein the first available programming state corresponds to substantially no accumulated charge on a floating gate of the memory cell, the second available programming state corresponds to an intermediate amount of accumulated charge on the floating gate, and the third available programming state corresponds to a maximum amount of accumulated charge on the floating gate.

6. The apparatus of claim 1, wherein the control circuit applies a first read voltage threshold to the memory cell which falls within the first read margin to identify the single bit logical value stored using SLC programming, and applies a different, second read voltage threshold to the memory cell which falls within the second read margin to identify the single bit logical value stored using VMLC programming.

7. The apparatus of claim 1, wherein the control circuit is further configured to use MLC programming to store a multi-bit logical value to the memory cell from available programming states that sequentially correspond to first, second, third and fourth multi-bit logical values, wherein the first available programming state used during SLC and VMLC programming corresponds to the available programming state used during MLC programming to represent the first multi-bit logical value, and the third available programming state used during VMLC programming corresponds to the available programming state used during MLC programming to represent the fourth multi-bit logical value.

8. The apparatus of claim 7, wherein the first, second, third and fourth multi-bit logical values are 11, 01, 00 and 10, respectively.

9. The apparatus of claim 1, wherein the control circuit switches from programming the memory cell using SLC programming to programming the memory cell using VMLC programming responsive to an accumulated aging parameter.

10. The apparatus of claim 9, wherein the accumulated aging parameter comprises a total accumulated count of program/erase (PE) cycles applied to the memory cell, and wherein the control circuit switches from SLC programming to VMLC programming responsive to the accumulated count of PE cycles reaching a predetermined threshold.

11. The apparatus of claim 1, wherein the control circuit programs the memory cell using MLC programming during a first number of consecutive program/erase (PE) cycles upon the memory cell, the control circuit programs the memory cell using SLC programming during a subsequent second number of consecutive PE cycles upon the memory cell, and the control circuit programs the memory cell using VMLC programming during a subsequent third number of consecutive PE cycles upon the memory cell.

12. An apparatus comprising:
a memory cell having sequential first, second, third and fourth available programming states to accommodate the storage of one or more bits to the memory cell, each bit having an associated logical value; and
a control circuit adapted to alternately store a single bit to the memory cell using single level cell (SLC) programming, multiple bits to the memory cell using multi-level cell (MLC) programming, and a single bit to the memory cell using virtual multi-level cell (VMLC) programming, wherein the SLC programming uses the first and third available programming states to alternately indicate the associated logical value of the stored single bit, wherein the MLC programming uses the first, second, third and fourth available programming states to alternately indicate the associated logical values of the stored multiple bits, and the VMLC programming uses the first and fourth available programming states to alternately indicate the associated logical value of the stored single bit.

13. The apparatus of claim 12, wherein the control circuit erases the memory cell between the storage of the single bit logical value using SLC programming and the storage of the single bit logical value using VMLC programming.

14. The apparatus of claim 12, wherein the memory cell is a flash memory cell and the first, second, third and fourth available programming states correspond to different total amounts of accumulated charge on a floating gate of the flash memory cell.

15. The apparatus of claim 12, wherein the memory cell is a resistive sense memory (RSM) cell and each of the plurality of available programming states corresponds to a different programmed electrical resistance of the cell.

16. The apparatus of claim 12, wherein the control circuit switches from using SLC or MLC programming to program the memory cell to using VMLC programming to program the memory cell responsive to a parameter associated with the memory cell.

17. The apparatus of claim 16, wherein the parameter comprises a total accumulated count of program/erase (PE) cycles applied to the memory cell, and wherein the control circuit switches from SLC or MLC programming to VMLC programming responsive to the accumulated count of PE cycles reaching a predetermined threshold.

18. The apparatus of claim 12, wherein the control circuit programs the memory cell using MLC programming during a first number of consecutive program/erase (PE) cycles upon the memory cell, the control circuit programs the memory cell using SLC programming during a subsequent second number of consecutive PE cycles upon the memory cell, and the control circuit programs the memory cell using VMLC programming during a subsequent third number of consecutive PE cycles upon the memory cell.

19. A method comprising:
providing a memory cell having a plurality of available programming states to accommodate the storage of one or more bits to the memory cell, each bit having an associated logical value;
storing a single bit having an associated logical value to the memory cell using single level cell (SLC) programming to provide a first read margin between first and second available programming states of said plurality; and
storing a single bit having an associated logical value to the memory cell using virtual multi-level cell (VMLC) programming having a larger, second read margin between the first available programming state and a third available programming state of said plurality.

20. The method of claim 19, further comprising erasing the memory cell between the respective storing steps, and storing the single bit using VMLC programming responsive to an accumulated aging parameter associated with the memory cell reaching a predetermined threshold.

* * * * *